US006960419B2

(12) United States Patent
West et al.

(10) Patent No.: US 6,960,419 B2
(45) Date of Patent: Nov. 1, 2005

(54) ANTIHALATION DYE FOR NEGATIVE-WORKING PRINTING PLATES

(75) Inventors: Paul R. West, Fort Collins, CO (US); Lee Korionoff, Fort Collins, CO (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 57 days.

(21) Appl. No.: 10/734,869

(22) Filed: Dec. 12, 2003

(65) Prior Publication Data

US 2005/0130064 A1 Jun. 16, 2005

(51) Int. Cl.⁷ .......................... G03F 7/021; G03F 7/30
(52) U.S. Cl. ................... 430/157; 430/175; 430/281.1; 430/288.1; 430/325
(58) Field of Search ............................. 430/157, 176, 430/281.1, 288.1, 325

(56) References Cited

U.S. PATENT DOCUMENTS

| | | | |
|---|---|---|---|
| 5,234,990 A | | 8/1993 | Flaim et al. |
| 5,543,262 A | | 8/1996 | Sypek et al. |
| 5,759,755 A | * | 6/1998 | Park et al. ................... 430/512 |
| 5,861,415 A | | 1/1999 | Majeed et al. |
| 6,251,562 B1 | * | 6/2001 | Breyta et al. ............ 430/287.1 |
| 6,528,235 B2 | | 3/2003 | Thackeray et al. |
| 2001/0012596 A1 | * | 8/2001 | Kunimoto et al. .......... 430/138 |
| 2002/0009670 A1 | * | 1/2002 | Thackeray et al. ...... 430/271.1 |

FOREIGN PATENT DOCUMENTS

| | | |
|---|---|---|
| EP | 0233056 B1 | 12/1993 |
| EP | 0780730 B1 | 8/2002 |

OTHER PUBLICATIONS

Plat et al; Formulation and Modeling of Dyed Positive I-line Resist for Control of the Reflective Notching and CD Variation; Proceedings of SPIE—The International Society for Optical Engineering; 1995; pp. 272-280; vol. 2438.

Cernigliaro et al; Dissolution Rate Modifying Chemistry: Interaction of Base-soluble and Base-insoluble Non-actinic Dyes with Novolak Polymers and Novolak-based Positive Photoresists; Proceedings of SPIE—The International Society for Optical Engineering; 1989; pp. 106-116; vol. 1086.

Renschler et al; Curcumin as a Positive Resist Dye Optimized for g- and h- Line Exposure; Journal of the Electrochemical Society; 1987; pp. 1586-1587; vol. 134, No. 6.

* cited by examiner

Primary Examiner—John S. Chu
(74) Attorney, Agent, or Firm—RatnerPrestia

(57) ABSTRACT

Negative working imageable compositions and imageable elements comprising a layer of the imageable composition over a support are disclosed. The imageable compositions comprise a free-radical polymerizable system and an effective amount of curcumin. The curcumin is effective as an antihalation agent, but does not substantially reduce the photospeed of the imageable composition.

15 Claims, No Drawings

ANTIHALATION DYE FOR NEGATIVE-WORKING PRINTING PLATES

FIELD OF THE INVENTION

The invention relates to lithographic printing. In particular, this invention relates an antihalation dye for negative working imageable elements.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically the ink is first transferred to an intermediate blanket, which in turn transfers the ink to the surface of the material upon which the image is to be reproduced.

Imageable elements useful as lithographic printing plate precursors typically comprise an imageable layer applied over the hydrophilic surface of a substrate. The imageable layer includes one or more radiation-sensitive components, which may be dispersed in a suitable binder. Alternatively, the radiation-sensitive component can also be the binder material. If, after imaging, the imaged regions of the imageable layer are removed revealing the underlying hydrophilic surface of the substrate, the precursor is positive working. Conversely, if the unimaged regions are removed, the precursor is negative working. In each instance, the regions of the imageable layer (i.e., the image areas) that remain are ink-receptive, and the revealed regions of the hydrophilic surface accept water and aqueous solutions, typically a fountain solution, and repel ink.

During imaging, scattered and reflected radiation can expose regions of the imageable layer in which exposure is not desired, reducing the sharpness of the image. Reflection of the imaging radiation by substrate or by the substrate/imaging layer interface can produce variations in the radiation intensity during imaging, producing non-uniform imaging. Radiation can scatter into regions of the imaging layer where imaging is not intended.

The use of antihalation dyes to prevent this unwanted exposure is well-known. The antihalation dye absorbs the imaging radiation. Because the scattered and reflected radiation has a longer path length in the imageable layer than radiation that impinges directly on the imageable layer, the scattered and reflected radiation is more strongly absorbed by the antihalation dye. Although the antihalation dye slightly reduces the overall speed of the imaging system, scattered and reflected radiation, which can produce a blurred image, is preferentially absorbed so that the overall definition and sharpness of image is increased.

The dye may be incorporated into a separate layer, typically between the imaging layer and the substrate, known as an antihalation layer. However, addition of this additional layer to the imageable element complicates the manufacturing process and makes it more expensive.

Alternatively, the dye may be incorporated into the imageable layer. However, the dye must be compatible with the other ingredients in the imageable layer, and except for absorbing some of the imaging radiation, not adversely affect with the physical and chemical changes that produce the image. When the image forming reaction is a free radical polymerization, the antihalation dye must not interfere with the free radical reaction.

Sypek, U.S. Pat. No. 5,543,262, the disclosure of which is incorporated herein by reference, discloses a composition that includes a photopolymerizable compound, a free radical generating component, and benzanthrone or a substituted benzanthrone. The benzanthrone or substituted benzanthrone substantially prevents photopolymerization when the composition is exposed to imaging radiation below a threshold amount but permits photopolymerization when the light sensitive composition is exposed to imaging radiation above a threshold amount. Although benzanthrone does not substantially affect imaging, in the manufacture of the imageable elements benzanthrone can sublime from the imageable composition during the drying step. Loss of benzanthrone produces an undesired variability in the finished product, and the sublimed benzanthrone contributes to nuisance dust in the manufacturing environment. Thus, a need exists for negative-working imageable elements that comprise an antihalation compound that does not substantially affect imaging, but that do not have these disadvantages.

SUMMARY OF THE INVENTION

In one aspect, the invention is an imageable composition comprising:

at least one ethylenically unsaturated monomer capable of free radical initiated addition polymerization;

a photoinitiator system;

optionally, at least one binder;

optionally, at least one light sensitive diazonium compound; and about 0.01 wt % to about 5 wt % of curcumin.

In another aspect, the invention is an imageable element comprising a layer of the imageable composition over a support. In yet another aspect, the invention is a method for forming an image by imaging and developing the imageable element.

Curcumin is a well-known free radical scavenger. Majeed, U.S. Pat. No. 5,861,415, column 2, line 36, to column 4, line 22, for example, discloses that curcumin has strong antioxidant properties because it neutralizes already formed free radicals. Thus, it is surprising and unexpected that curcumin can be used as an antihalation dye in a free radical radiation polymerizable composition.

DETAILED DESCRIPTION OF THE INVENTION

Unless the context indicates otherwise, in the specification and claims, the terms binder, photoinitiator system, monomer, diazonium compound, coating solvent, and similar terms also include mixtures of such materials. Unless otherwise specified, all percentages are percentages by weight.

Imageable Elements

The negative-working imageable element comprises a layer of an imageable composition over a substrate. The imageable layer comprises a negative-working imageable composition.

Imageable Composition

Negative working imageable compositions comprise at least one ethylenically unsaturated, free radical polymerizable monomer; at least one photoinitiator system; optionally at least one binder; and optionally at least one light sensitive diazonium compound. In addition, the imageable composition comprises curcumin. Other ingredients that are conventional components of photopolymerizable compositions may also be present.

Negative working imageable compositions are generally described, for example, in "Photopolymers: Radiation Curable Imaging Systems," by B. M. Monroe, in *Radiation Curing: Science and Technology*, S. P. Pappas, Ed., Plenum, N.Y., 1992, pp. 399–440, and "Polymer Imaging" by A. B. Cohen and P. Walker, in *Imaging Processes and Material*, J. M. Sturge, et al., Eds., Van Nostrand Reinhold, N.Y., 1989, pp. 226–262.

Monomers

The imageable composition comprises at least one ethylenically unsaturated compound that undergoes free-radical initiated polymerization, generally known as a monomer. Numerous monomers polymerizable by free-radical initiated polymerization and useful in imageable compositions are known to those skilled in the art.

The monomers are typically multifunctional, i.e., they comprise more than one ethylenically unsaturated, free radical polymerizable group. Typical multifunctional monomers are unsaturated esters of alcohols, preferably acrylate and methacrylate esters of polyols preferably containing 2 to 30 carbon atoms, such as, trimethylol propane tri- and tetraacrylate and methacrylate; the tri- and tetraacrylate and methacrylate esters of ethoxylated trimethylolpropane; diethylene glycol diacrylate and dimethacrylate; triethylene glycol diacrylate and dimethacrylate; 1,4-butanediol diacrylate and dimethacrylate; 2,2,4-trimethyl-1,3-pentanediol diacrylate and dimethacrylate; 1,8-octanediol diacrylate and dimethacrylate; 1,10-decanediol diacrylate and dimethacrylate; polyethylene glycol diacrylate and dimethacrylate, preferably having an average molecular weight in the range from 200 to 2000; glycerol triacrylate and trimethacrylate; ethylene glycol dimethacrylate; pentaerythritol tri- and tetraacrylate and tri- and tetramethacrylate; dipentaerythritol penta- and hexaacrylate and penta- and hexamethacrylate; tripentaerythritol octaacrylate and octamethacrylate; sorbitol tri-, tetra-, penta-, and hexaacrylate and tri-, tetra-, penta-, and hexamethacrylate; tripropylene glycol diacrylate and dimethacrylate; the di-(2-acryloxyethyl)ether and the di-(2-methacryloxyethyl)ether of bisphenol A; ethoxylated bisphenol A diacrylate and dimethacrylate; 1,6-hexanediol diacrylate and dimethacrylate; and neo-pentyl glycol diacrylate and dimethacrylate. Monofunctional monomers, which are sometimes used in combination with multifunctional monomers include, for example, t-butyl acrylate and methacrylate, N,N-diethylaminoethyl acrylate, 2-hydroxyethyl methacrylate, 2-hydroxypropyl methacrylate, 2-ethoxyethyl acrylate and methacrylate, 2-(2-ethoxyethoxy)ethyl acrylate and methacrylate, 2-ethylhexyl acrylate and methacrylate, octyl acrylate and methacrylate, lauryl acrylate and methacrylate, 2-phenoxyethyl acrylate and methacrylate, benzyl acrylate and methacrylate, iso-bornyl acrylate and methacrylate, phenyl acrylate and methacrylate, N-vinyl carbazole, 2-phenylethyl acrylate and methacrylate, and tetrahydrofurfuryl acrylate and methacrylate.

The imageable composition may also comprise one or more oligomers, prepolymers, and/or polymers substituted with free radical polymerizable groups. Examples of these materials are: urethane acrylates and methacrylates, epoxide acrylates and methacrylates, polyester acrylates and methacrylates, polyether acrylates and methacrylates; unsaturated polyester resins; and acrylamide substituted cellulose acetate butyrate and cellulose acetate propionate, such as are disclosed in Verbanac, U.S. Pat. Nos. 4,557,951 and 4,490,516.

Photoinitiator Systems

A free radical generating, initiating system activatable by ultraviolet or visible radiation, known as a photoinitiator system, is present to facilitate polymerization of the polymerizable monomers. The photoinitiator system absorbs in ultraviolet and/or visible regions of the spectrum, i.e., in the range of from 300 to 800 nm, preferably in the ultraviolet, i.e. 300 nm to 400 nm. The photoinitiator system may be a single compound or a mixture of compounds. Photoinitiator systems are disclosed in, for example, "Photoinitiators for Free-Radical-Initiated Photoimaging Systems," by B. M. Monroe and G. C. Weed, *Chem. Rev.*, 93, 435–448 (1993) and in "Free Radical Polymerization" by K. K. Dietliker, in *Chemistry and Technology of UV and EB Formulation for Coatinqs, Inks, and Paints*, P. K. T. Oldring, Ed, SITA Technology Ltd., London, 1991, Vol. 3, pp. 59–525.

Typical photoinitiator systems include, for example, Michlers ketone/benzophenone; ethyl Michlers ketone/benzophenone; benzophenone; 2-hydroxy-2-methyl-1-phenyl-propan-1-one; benzoin methyl ether; 2,4,6-trimethylbenzoyl-diphenylphosphine oxide; 2-isopropylthioxanthone; 2-chlorothioxanthone; 2,2-dimethoxy-2-phenyl-acetophenone; 2-methyl-1-[4-(methylthio)phenyl]-2-morpholinopropanone-1; 1-hydroxycyclohexylphenyl ketone; bis(2,6-dimethoxybenzoyl)-2,4,4-trimethyl-pentylphosphine oxide; bis(pentafluorophenyl)titanocene; and combinations thereof. Other useful photoinitiator systems include haloalkyl-substituted s-triazines substituted with one to three —$CX_3$ groups in which is X is bromo or, preferably, chloro. These compounds are disclosed, for example, in Smith, U.S. Pat. No. 3,779,778. Examples include 2-phenyl-4,6-bis(trichloromethyl)-s-triazine, 2,4,6-tris(trichloromethyl)-s-triazine, 2-methyl-4,6-bis(trichloromethyl)-s-triazine, 2-(styryl-4,6-bis(trichloromethyl)-s-triazine, 2-(p-methoxystyryl)-4,6-bis(trichloromethyl)-s-triazine, 2-(4-methoxy-naphtho-1-yl)-4,6-bis-trichloromethyl-s-triazine, 2-(4-ethoxy-naphtho-1-yl)-4,6-bis-trichloromethyl-s-triazine, and 2-[4-(2-ethoxyethyl)-naphtho-1-yl]-4,6-bis-trichloromethyl-s-triazine).

Binders

The imageable composition may comprise a binder. The binder is a preformed macromolecular polymeric or resinous material. In general, the binder should be soluble, or at least swellable, in the coating solvent and compatible with the other components of the imageable composition.

Numerous binders useful in imageable compositions are known. Representative binders include, for example, poly(methyl methacrylate); copolymers of methyl methacrylate with alkyl acrylates, methacrylic acid, acrylic acid, and/or other alkyl methacrylates such as butyl methacrylate, allyl methacrylate, and ethyl methacrylate; polymers and copolymers of alkyl acrylates such as methyl acrylate, ethyl acrylate, and butyl acrylate, and/or other alkyl methacrylates such as ethyl methacrylate, butyl methacrylate, and hexyl methacrylate with methacrylic acid, and/or acrylic acid; poly(vinyl acetate) and its partially hydrolyzed derivatives; polyvinyl acetals; polyurethanes; gelatin; cellulose esters and ethers, such as cellulose acetate butyrate; and polyethylene oxides. Numerous other binders are known to those skilled in the art. Representative binders are listed in Ishikawa, U.S. Pat. No. 4,481,276.

For photoresist applications the preferred binders are copolymers of methyl methacrylate, ethyl acrylate, and methacrylic acid. Copolymers of methyl methacrylate, ethyl acrylate, and methacrylic acid copolymerized with a small amount of allyl methacrylate may also be used.

For the preparation of imageable elements useful as lithographic printing plate precursors, the binder is preferably selected from the group consisting of polyvinyl acetals, acrylics and polyurethanes. The binder may comprises acidic groups. The most preferred acid group is a carboxylic acid group. A useful binder is an acrylic binder with an acid number in the range of 20 to 180 mg KOH/g. Optionally, the binder may comprise unsaturated groups capable of undergoing free radical photopolymerization reaction or other photoreactions, such as 2+2-photocycloaddition, in the main chain or in a side chain.

Curcumin

The imageable composition comprises curcumin, i.e., 1,7-bis(4-hydroxy-3-methoxyphenyl)-1,6-heptadiene-3,5-dione:

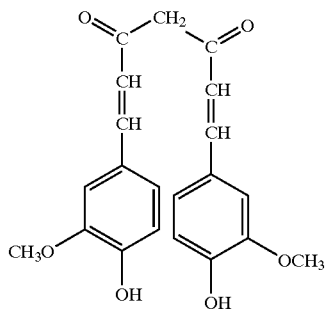

Curcumin, also known as tumeric yellow or diferuloylmethane, is a naturally occurring compound extracted from the roots of the *Curcuma longa* plant.

An effective amount of curcumin is present in the imageable composition, that is, an amount effective to reduce halation but not to reduce substantially the photospeed of the imageable composition. This is an amount of curcumin sufficient to substantially prevent free radical initiated polymerization of the monomer in regions of the imageable layer in which the initiator system is exposed to actinic radiation below a threshold amount but to permit polymerization of the monomer when the initiator system is exposed to actinic radiation above the threshold amount. Although this amount of curcumin will depend on the thickness of the layer of imageable composition, the amount of reflected and scattered imaging radiation, and the efficiency of the initiator system, typically about 0.05 wt % to about 5.0 wt %, more typically about 0.1 wt % to about 3.0 wt %, even more typically about 0.2 wt % to about 2.0 wt %, of curcumin is present in the imageable composition.

Diazonium Compounds

The imageable composition may comprise a light sensitive diazonium compound. Typical diazonium compounds are disclosed in *Light Sensitive Systems*, J. Kosar, Wiley, New York, 1965, pages 194–214 and 321–330. They may be generally represented by the formula: $ArN_2^+ X^-$, in which Ar is an aromatic group, and X is an anion. These compounds are disclosed, for example, in Notley, U.S. Pat. No. 3,485,631; James, U.S. Pat. No. 3,032,414; Buni, U.S. Pat. No. 2,923,703; and Baril, U.S. Pat. No. 2,976,145. Condensation products of diazonium salts with aldehydes, such as formaldehyde, are described in Jewett, U.S. Pat. No. 2,714,066; and Steppan, U.S. Pat. No. 3,849,392. Typical diazonium compounds include, for example: p-diazo diphenylamine sulfate; p-diazo-N,N-dimethylaniline zinc chloride; p-diazo-N,N-diethylaniline zinc chloride; p-diazo N-ethyl N-hydroxyethylaniline zinc chloride, p-diazo N-ethyl N-methyl aniline zinc chloride; 3-methyl-4-diethyl amino benzene diazonium chloride; 1-diazo-2-oxy naphthalene-4-sulfonate; 4-diazo-2-methoxy-1-cyclohexylamino benzene p-chlorobenzene-sulfonate; 4-N,N-dimethylaniline chloride; p-diazo-N,N-diethylaniline fluoroborate; p-diazodiphenylamine sulfate; (2,5-diethoxy-4-(4'-tolylthio))-benzene diazonium fluoroborate; 2,5-diethyoxy-4-N-morpholino-benzene diazonium fluoroborate; 2,5-diethyoxy-4-piperidyl-benzene diazonium chloride; 4-morpholino benzene diazonium chloride; 2,4-benzylamino-2,5-diethoxy benzene diazonium chloride; 4-piperidyl-2,5-diethoxy benzene diazonium chloride; 1-dimethyl amino naphthalene-4-diazonium chloride; and 4-phenyl amino diazo benzene diazonium chloride.

Diazonium containing polymers may be formed from condensation of a suitable monomeric diazonium or mixture of monomeric diazoniums with a suitable condensing agent in the presence of a strong acid. Typical monomeric diazoniums include, for example, 4-diazodiphenylamine sulfate; 3-methoxy-4-diazodiphenylamine sulfate; 4-diazo-4'-methoxydiphenylamine sulfate; 2,5-diethoxy-4-diazo-4'-thiotolyl sulfate and combinations thereof. Typical condensing agents include, for example, formaldehyde; paraformaldehyde; 4,4'-bismethoxymethyl diphenyl ether; 4,4-bishydroxymethyl diphenylether; 4,4'-bismethoxymethyl diphenylsulfide; 4,4'-bismethoxymethyl bisphenol A and combinations thereof. Strong acids include, for example, sulfuric acid, phosphoric acid, trifluoromethyl sulfonic acid and nitric acid. Anions used to isolate the condensation products include, for example, p-toluenesulfonate, hexafluorophosphate, tetrafluoroborate, mesitylenesulfonate, and trifluoromethlysulfonate.

Other Ingredients

Other components conventionally added to imageable compositions can be present to modify the physical properties of the photosensitive layer. Such components include, for example: chain transfer agents, plasticizers, thermal stabilizers, optical brighteners, ultraviolet radiation absorbing materials, adhesion modifiers, coating aids, and release agents.

A plasticizer may be present to modify adhesion, flexibility, hardness, and other mechanical properties of the photosensitive layer in a conventional fashion. When a binder is present, a plasticizer would be selected which is compatible with the binder as well as the monomer and other components of the composition. Suitable plasticizers include dibutyl phthalate, dioctyl phthalate, didodecyl phthalate, dioctyl adipate, dibutylsebacate, triacetyl glycerine, and tricresyl phosphate. When present, the amount of plasticizer used is preferably 0.25 to 10 wt %.

The composition may comprise a small amount of a polymerization inhibitor to inhibit polymerization of the monomer during preparation and storage of the composition. Suitable polymerization inhibitors include, for example, hydroquinone, p-methoxyphenol, di-t-butyl-p-cresol, pyrogallol, t-butyl catechol, benzoquinone, 4,4'-thio-bis-(3-methyl-6-t-butylphenol), 2,2'-methylene-bis-(4-methyl-6-t-butylphenol) and N-nitrosophenylhydroxylamine salts. When present, the amount of the thermal polymerization inhibitor used is preferably from 0.01 wt % to about 5 wt % based on the weight of the entire composition.

Surfactants may be added to the imageable composition as coating aids. Typical surfactants are non-ionic surfactants such as polyethylene oxides, ethoxylated alcohols, and ethoxylated alkyl phenols.

Depending on the application, other inert additives can be added such as dyes, pigments and fillers. A dye or pigment may also be added to color the imageable layer. Examples of the coloring agents include pigments such as phthalocyanine-based pigment, azo-based pigment, carbon black and titanium oxide, Ethyl Violet, Crystal Violet, azo-based dyes, anthraquinone-based dyes and cyanine-based dyes. The amount of dyestuff or pigment added is preferably from 0.5 to about 10 wt % based on the entire composition. The coloring agent should not absorb strongly at the wavelength of the radiation used for imaging. These additives are generally present in minor amounts so as not to interfere with the exposure of the imageable composition.

Composition

Although the composition of the imageable composition will depend on its intended application, when a diazonium compound is not present, the imageable composition typically comprises, binder(s) 0 to about 90 wt %, preferably about 10 to about 60 wt %; monomer(s), about 5 to about 80 wt %, preferably, about 15 to about 70 wt %; photoinitiator system, about 0.01 to about 15 wt %, preferably about 0.1 to about 12 wt %; more preferably about 0.5 to 10 wt %, even more preferably 2 to 8 wt %; and other ingredients, 0 to about 20 wt %, typically 0 to about 10 wt %, based on the dry weight (i.e., exclusive of solvents) of the composition. In general, when a binder is present, the binder should be at least about 25 wt % of the composition and the monomer should not exceed about 80 wt % of the composition.

The amount of photoinitiator system present depends on the intended use of the imageable element, the wavelength(s) of actinic radiation used for imaging, the absorption spectrum of the photoinitiator system, and the thickness of the layer of imageable composition. As described by Thommes and Webers, *J. Imag. Sci.,* 29, 112 (1985), an optical density of 0.43 produces efficient polymerization for systems that are developed by washout, such as photoresists and lithographic printing plates. It is also generally preferred that the absorption maximum of the photoinitiator system be matched to the intensity maximum of the source of actinic radiation.

When present, the diazonium compound is present in an amount sufficient to form a light sensitive composition that is sensitive to actinic radiation in the range of from about 300 nm to about 550 nm. The diazonium compound typically comprises about 0.5 wt % to about 25 wt %, more typically about 5 wt % to about 10 wt %, even more typically from about 5 wt % to about 10 wt %, of the imageable composition, based on the dry weight of the imageable composition. The photoinitiator system typically comprises about 0.5 to about 20 wt % of the imageable composition. Polymerizable monomers and, optionally, other ingredients as described above comprise the rest of the imageable composition.

Substrate

The imageable composition may be coated over a variety of substrates. The particular substrate will generally be determined by the intended application. For lithographic printing, the substrate comprises a support, which may be any material conventionally used to prepare imageable elements useful as lithographic printing plates. The support is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

Typically, polymeric films contain a sub-coating on one or both surfaces to modify the surface characteristics to enhance the hydrophilicity of the surface, to improve adhesion to subsequent layers, to improve planarity of paper substrates, and the like. The nature of this layer or layers depends upon the substrate and the composition of subsequent coated layers. Examples of subbing layer materials are adhesion-promoting materials, such as alkoxysilanes, aminopropyltriethoxysilane, glycidoxypropyltriethoxysilane and epoxy functional polymers, as well as conventional subbing materials used on polyester bases in photographic films.

The surface of an aluminum support may be treated by techniques known in the art, including physical graining, electrochemical graining, chemical graining, and anodizing. The substrate should be of sufficient thickness to sustain the wear from printing and be thin enough to wrap around a printing form, typically from about 100 $\mu$m to about 600 $\mu$m. Typically, the substrate comprises an interlayer between the aluminum support and the layer of imageable composition. The interlayer may be formed by treatment of the support with, for example, silicate, dextrine, hexafluorosilicic acid, phosphate/fluoride, polyvinyl phosphonic acid, vinyl phosphonic acid copolymers, or a water-soluble diazo resin.

The back side of the substrate (i.e., the side opposite the imageable layer) may be coated with an antistatic agent and/or a slipping layer or matte layer to improve handling and "feel" of the imageable element.

Overcoat

For certain applications, such as for lithographic printing applications, it may be advantageous to overcoat the imageable layer with a substantially oxygen-impermeable layer that is soluble in the developer and transparent to the actinic radiation used for imaging. The overcoat protects the imageable layer from damage during production and handling of the element and acts as an oxygen barrier layer during imaging.

Preferred binders for the overcoat are water-soluble polymers such as polyvinyl alcohol, polyvinyl alcohol/polyvinyl acetate copolymers, polyvinyl pyrrolidone, vinyl pyrrolidone/vinyl acetate copolymers, polyvinyl methyl ether, ring-opened copolymers of maleic anhydride and co-monomers such as methyl vinyl ether, polyacrylic acid, gelatine, and cellulose ethers. Most preferred is polyvinyl alcohol.

Preparation of the Imageable Element

The element precursor may be prepared by applying the imageable layer over the hydrophilic surface of the substrate using conventional techniques. The imageable layer may be applied by any conventional method, such as coating or lamination. Typically the ingredients are dispersed or dissolved in a suitable coating solvent, and the resulting mixture coated by conventional methods, such as spin coating, bar coating, gravure coating, die coating, slot coating, or roller coating. Typical coating solvents are acetone, methyl ethyl ketone, cyclohexane, ethyl acetate, tetrahydrofuran, toluene, ethylene glycol monomethyl ether, ethylene glycol dimethyl ether, propylene glycol monomethyl ether, acetylacetone, cyclohexanone, diacetone alcohol, ethylene glycol monomethyl ether acetate, ethylene glycol monoethyl ether acetate, ethylene glycol monoisopropyl ether acetate, ethylene glycol monobutyl ether acetate, 3-methoxypropanol, methoxymethoxyethanol, diethylene glycol monomethyl ether, diethylene glycol monoethyl ether, propylene glycol monomethylether acetate, propylene glycol monoethylether acetate, 3-methoxypropyl acetate, N,N-dimethylformamide, dimethyl sulfoxide, γ-butyrolactone, methyl lactate, and ethyl lactate. These solvents may be used individually or in combinations. The solid content of the coating solution is typically about 1 to about 50 wt %.

After coating, the imageable layer is dried to remove the coating solvent. Typically, the imageable layer has a coating weight of about 0.1 to about 4 g/m$^2$, more typically about 0.15 to about 3 g/m$^2$; preferably about 0.2 g/m$^2$ to about 1.5 g/m$^2$; more preferably about 0.3 g/m$^2$ to about 1 g/m$^2$.

After the layer of photosensitive material has been dried, a release film, typically a polyethylene or polypropylene film, may be adhered to the layer of photosensitive material. Alternatively, an overcoat may be applied to the layer of photosensitive material. The overcoat is typically coated from aqueous solution.

Imaging and Processing

When imaged with the appropriate radiation, the photoinitiator system generates free radicals that initiate polymerization of the monomer in the imaged regions. The unimaged regions of the imageable layer are removed by a developer, revealing the underlying regions of the substrate.

Any convenient source or sources of actinic radiation providing wavelengths in the region of the spectrum that overlap the absorption bands of the sensitizer can be used for imaging. "Actinic radiation" means radiation that is active to produce the free-radicals necessary to initiate polymerization of the monomer(s) in the photosensitive composition. The radiation can be natural or artificial, monochromatic or polychromatic, incoherent or coherent, and for high efficiency should correspond closely in wavelength to the absorption of the photoinitiator system. Conventional light sources include fluorescent lamps, mercury, metal additive and arc lamps. Coherent light sources are helium, cadmium, helium-neon lasers, xenon, argon ion, and krypton ion, as well as tunable dye lasers, semiconductor lasers, solid state lasers such as the ruby laser, and the frequency doubled neodymium:YAG laser, whose emissions fall within or overlap the visible absorption bands of the sensitizer. For the exposure of holographic photopolymer systems, coherent light sources, i.e., lasers, are required.

Conventionally, imaging of the imageable element with ultraviolet and/or visible radiation has been carried out through a mask, which has clear and opaque regions. However, direct digital imaging of imageable elements, which obviates the need for imaging through a negative, is becoming increasingly important in the printing industry. The photosensitive compositions may be directly imaged by, for example, a computer-controlled laser, eliminating need for preparation of an intermediate photomask. Imaging may be carried out with the argon ion laser (488 nm) or the FD-Nd-YAG laser (532 nm). Platesetters that provide direct digital ultraviolet imaging include the Metro Ultraviolet Computer to Plate System (PerkinElmer Optoelectronics, Azusa, Calif., USA), which is reported to use an argon ion laser emitting in the range of 351 to 364 nm; the Metro ST Ultraviolet Computer to Plate Systems (PerkinElmer Optoelectronics, Azusa, Calif., USA), which are reported to use diode pumped solid state lasers emitting in the range of 355 nm; the FasTRAK CTP/C Imagesetter (alphaQuest Technologies, Rolling Meadows, Ill., USA), which is reported to use an ultraviolet laser emitting at 355 nm); and the BasysPrint ultraviolet platesetter, which uses a collimated ultraviolet light source rather than an ultraviolet laser (BasysPrint, Boizenburg, Germany).

Following imaging, the photosensitivity of the layer of photosensitive material can be increased by briefly heating the imaged element to about 60° C. to about 180° C. prior to the developing step.

Developers for photoimageable elements comprising photopolymerizable photosensitive compositions are well-known. Development may be carried out, for example, with organic solvents. However, slightly alkaline aqueous solutions are preferred. Aqueous developers may also comprise minor amounts (0.5 wt % to about 15 wt %, based on the weight of the developer, preferably between about 3 wt % and about 5 wt %, based on the weight of the developer) of water-miscible organic solvents. The following solvents and mixtures of these solvents are suitable for use in the developer: the reaction products of phenol with ethylene oxide and propylene oxide, such as ethylene glycol phenyl ether; benzyl alcohol; esters of ethylene glycol and of propylene glycol with acids having six or fewer carbon atoms, and ethers of ethylene glycol, diethylene glycol, and of propylene glycol with alkyl groups having six or fewer carbon atoms, such as 2-ethoxyethanol and 2-butoxyethanol.

Other conventional additives such as wetting agents, dyes or salts may also be present. Preferred surfactants include: alkali metal salts of alkyl naphthalene sulfonates; alkali metal salts of the sulfate monoesters of aliphatic alcohols, typically having six to nine carbon atoms; and alkali metal sulfonates, typically having six to nine carbon atoms. A preferred alkali metal is sodium. The developer may also comprise a buffer system to keep the pH relatively constant, typically between about 5.0 and about 13.0, preferably between about 7.0 and about 12.0, more preferably between about 8.0 and about 12.0. Filter dyes or mixtures of filter dyes that absorb in the same region as the sensitizer, such as metanil yellow (C.I. 13065) and other similar water soluble azo dyes, and/or free radical inhibitors, such as those that contain the quinone or hydroquinone moieties, for example benzoquinone, hydroquinone, 4-methoxyphenol, 2,6-di-t-butyl-4-methylphenol, may be added to the developer to prevent the formation of sludge during processing.

Typically the developer is applied to the imaged element by rubbing or wiping the imageable layer with an applicator containing the developer. Alternatively, the imaged element may be brushed with the developer or the developer may be applied to the element by spraying the imageable layer with sufficient force to remove the exposed regions. In either instance, a developed element is produced. Development may be carried out in a commercial processor, such as the MercuryNewS™ Processor (Kodak Polychrome Graphics), Sprinter 72 (Kodak Polychrome Graphics), and PC 85 (Unigraph Ltd.).

Following development, the imaged and developed element is typically rinsed with water and dried. Drying may be conveniently carried out by infrared radiators or with hot air.

The developed element comprises (1) regions in which the imageable layer has been removed in the unexposed regions substrate, and (2) complimentary exposed regions in which the layer or layers have not been removed. If the imageable element is a printing plate precursor, development reveals the hydrophilic surface of the underlying substrate. The regions of the layer or layers that have not been removed are ink receptive and correspond to the regions that were not exposed during imaging.

INDUSTRIAL APPLICABILITY

Once the imageable element has been imaged and processed to form a printing plate, printing can be carried out by applying a fountain solution and then a lithographic ink to the image on its surface. Fountain solution is taken up by the surface of the substrate exposed by imaging and development, and the ink is taken up by the complementary regions. The ink is transferred to a suitable receiving material (such as cloth, paper, metal, glass or plastic) either directly or indirectly using an offset printing blanket to provide a desired impression of the image thereon.

The advantageous properties of this invention can be observed by reference to the following examples, which illustrate but do not limit the invention.

EXAMPLES

In the Examples, "coating solution" refers to the mixture of solvent or solvents and additives coated, even though some of the additives may be in suspension rather than in solution.

Glossary

Diazo Resin B Diazo resin of the condensation product of 3-methoxydiphenylamine-4-diazonium bisulfate with 4,4'-bis(methoxymethyl)diphenyl ether isolated as the hexafluorophosphate Diazo TG-3 Diazo resin of the condensation product of 4-diazodiphenylamine sulfate with formaldehyde (P.J.S. Chemicals, Tadcaster, North Yorkshire, UK)

Diazo-19 Diazo resin (St. Jean Photo Chemicals, Quebec, Canada)

Edaplan LA 411 Surfactant (Munzing Chemie, Heilbronn, Germany)

Estane 5715 Polyester-type thermoplastic polyurethane (Noveon, Cleveland, Ohio, USA)

Jaylink 106E Acrylamidomethyl substituted cellulose ester (Bomar Specialties, Winsted, Conn., USA)

Penn Color 79S452C Pigment dispersion (Penn Color, Doylestown, Pa., USA)

SR9041 Multifunctional acrylate ester (Sartomer, Exton, Pa., USA)

Surfactant 10G p-Nonylphenoxypolyglycidol containing about ten glycidol units (Arch Chemicals, Norwalk, Conn., USA)

Example 1 and Comparative Example 1

This example illustrates the use of curcumin as an antihalation dye.

Coating solutions were prepared as shown in Table 1.

TABLE 1

|  | Example 1 | Comparative Example 1 |
| --- | --- | --- |
| SR9041 | 0.98 | 0.98 |
| Jaylink 106E | 0.27 | 0.27 |
| Estane 5715 | 0.27 | 0.27 |
| Triazine[a] | 0.22 | 0.22 |
| Metanil Yellow | 0.05 | 0.05 |
| Curcumin | 0.01 | 0 |
| Diazo-19 | 0.07 | 0.07 |
| Diazo Resin B | 0.16 | 0.16 |
| Penn Color 79S452C | 0.43 | 0.43 |
| Edaplan LA 411 | 0.01 | 0.01 |
| Methyl lactate | 24.38 | 24.38 |
| Di(ethyleneglycol)methyl ether | 34.13 | 34.14 |
| 1-Methoxy-2-propanol | 19.51 | 19.51 |
| Methanol | 19.51 | 19.51 |

[a]2,4-bis(trichloromethyl)-6-[4-(4-hydroxypropoxy)styryl]-1,3,5-triazine

A substrate was prepared by coating an electrochemically grained and anodized aluminum substrate post-treated with sodium silicate with a coating solution consisting of 0.214 g of Diazo TG-3 and of 0.121 g of Surfactant 10G in 199.66 g of water. The resulting substrate was dried at about 60° C. (140° F.). The dry coating weight was 25 mg/m$^2$.

The coating solutions in Table 1 were coated onto the substrate and dried at about 82° C. (180° F.). The dry coating weight of the resulting imageable layer was 0.63 g/m$^2$. The imageable layer contains about 0.4 wt % of curcumin.

The resulting imageable elements were imaged in an ultraviolet exposure unit (Olec Corp. Irvine, Calif.) at 100, 200, and 300 mJ/cm$^2$ using a negative plate scale target (UGRA scale) and a FOGRA KKS-halation scale (Fogra, Munchen, Germany). The imaged imageable elements were developed using SP200 Subtractive negative developer (Kodak Polychrome Graphics, Norwalk, Conn.).

The FOGRA scale comprises three circular elements with 25 mm (1-inch) diameter, which consist of 50 $\mu$m-wide positive lines. The covered area percentage and the screen ruling are 20% and 40 lines/cm (100 lines per inch), respectively. A spacer forms the center of each circle element. The thickness of the spacers 2 is double and 3 is triple that of circle 1, which is 75 $\mu$m±5 $\mu$m (0.03 inch) thick. If placed in contact with a plate, the spacers cause well-defined, artificial halation patterns, the diameters of which increase from circle element 1 to circle element 3. The circles are numbered from 0 to 40 so that a quantitative evaluation is possible, that is, if the halation extends to line No. 10, 2.5 mm (0.1 inch) has been lost, line 20 corresponds to 5 mm (0.2 inch), etc.

Comparative Example 1 gave a good image after development but with a halation effect at the circle element #1 at about 10 or 2.5 mm at the 300 mJ/cm$^2$ exposure. Example 1 gave good images after development but without a halation effect at the circle element #1, 2 or 3 at the 300 mJ/cm$^2$ exposure.

Comparative Example 1 had a Control Rating speed of 84. Example 1 had a Control Rating speed of 75. The Control Rating speeds are log values, such that the ratio of the speed of the comparative plate to the invention plate is given by $10^{((84-75)/100)}=1.23$. That is, Example 1 requires only 23% more exposure than Comparative Example 1.

Example 2 and Comparative Example 2

A coating solution was prepared as detailed in Table 2.

TABLE 2

|  | Example 2 |
| --- | --- |
| SR9041 | 0.98 |
| Jaylink 106E | 0.27 |
| Estane 5715 | 0.27 |
| Triazine[a] | 0.22 |
| Metanil Yellow | 0.05 |
| Curcumin | 0.03 |
| Diazo-19 | 0.07 |
| Diazo Resin B | 0.16 |
| Penn Color 79S452C | 0.43 |
| Edaplan LA 411 | 0.01 |
| Methyl lactate | 24.38 |
| Di(ethyleneglycol)methyl ether | 34.13 |
| 1-Methoxy-2-propanol | 19.50 |
| Methanol | 19.50 |

[a]2,4-bis(trichloromethyl)-6-[4-(4-hydroxypropoxy)styryl]-1,3,5-triazine

The procedure of Example 1 was repeated. The imageable layer contains about 1.2 wt % of curcumin.

The imageable element was imaged with 14 units of exposure and developed as in Example 1. The resulting printing plate had a solid step 4 and partial step 6 on the T-14 scale and exhibited no halation in any of the FOGRA circles.

Comparative Example 2 was an imageable element prepared as in Example 2 but without curcumin. It was imaged with 7 units of exposure and developed as in Example 2. Although the resulting plate had the same solid and partial steps on the T-14 scale, halation effects were clearly visible in the FOGRA circle element #2.

Having described the invention, we now claim the following and their equivalents.

What is claimed is:

1. An imageable composition comprising:
   at least one ethylenically unsaturated monomer capable of free radical initiated addition polymerization;
   a photoinitiator system; and
   about 0.01 wt % to about 5 wt % of curcumin.

2. The imageable composition of claim 1 additionally comprising at least one binder.

3. The imageable composition of claim 2 in which the composition comprises about 0.1 wt % to about 3 wt % of the curcumin.

4. The imageable composition of claim 3 additionally comprising at least one light sensitive diazonium compound.

5. The imageable composition of claim 4 in which the composition comprises about 0.2 wt % to about 2 wt % of the curcumin.

6. The imageable composition of claim 1 in which the composition comprises about 0.2 wt % to about 2 wt % of the curcumin.

7. An imageable element comprising a layer of imageable composition over a substrate;
   the imageable composition comprising:
   at least one ethylenically unsaturated monomer capable of free radical initiated addition polymerization;
   a photoinitiator system; and
   about 0.01 wt % to about 5 wt % of curcumin.

8. The imageable element of claim 7 additionally comprising at least one binder.

9. The imageable element of claim 8 in which the composition comprises about 0.1 wt % to about 3 wt % of the curcumin.

10. The imageable element of claim 9 additionally comprising at least one light sensitive diazonium compound.

11. The imageable element of claim 10 in which the composition comprises about 0.2 wt % to about 2 wt % of the curcumin.

12. The imageable element of claim 7 in which the composition comprises about 0.2 wt % to about 2 wt % of the curcumin.

13. A method for forming an image, the method comprising the steps of:
   a) imaging an imageable element comprising an imageable layer over a support and forming an imaged imageable element comprising imaged regions and complementary unimaged regions in the imageable layer; and
   b) developing the imaged imageable element in a developer and removing the unimaged regions without removing the imaged regions;
   in which
   the imageable layer comprises;
   at least one ethylenically unsaturated monomer capable of free radical initiated addition polymerization;
   a photoinitiator system; and
   about 0.01 wt % to about 5 wt % of curcumin; and
   imaging is carried out with ultraviolet or visible radiation.

14. The method of claim 13 in which the imageable layer comprises about 0.2 wt % to about 2 wt % of the curcumin.

15. The method of claim 14 in which the imageable layer additionally comprises a binder.

* * * * *